United States Patent [19]

Choi

[11] Patent Number: 5,786,711
[45] Date of Patent: Jul. 28, 1998

[54] DATA OUTPUT BUFFER FOR USE IN A SEMICONDUCTOR MEMORY DEVICE

[75] Inventor: Hoon Choi, Seoul, Rep. of Korea

[73] Assignee: Samsung Electronics, Co., Ltd., Suwon, Rep. of Korea

[21] Appl. No.: 668,094

[22] Filed: Jun. 17, 1996

[30] Foreign Application Priority Data

Jun. 17, 1995 [KR] Rep. of Korea ................ 16175/1995

[51] Int. Cl.⁶ ................ H03K 19/0185; H03K 19/017
[52] U.S. Cl. .................. 326/83; 326/17; 326/68; 365/189.05
[58] Field of Search ................ 326/63, 68, 80, 326/81, 83, 86, 88, 17; 327/537; 365/189.05, 189.09

[56] References Cited

U.S. PATENT DOCUMENTS

| | | | |
|---|---|---|---|
| 5,128,560 | 7/1992 | Chern et al. | 326/81 |
| 5,144,165 | 9/1992 | Dhong et al. | 326/80 |
| 5,444,396 | 8/1995 | Soneda | 326/81 |
| 5,473,268 | 12/1995 | Declercq et al. | 326/68 X |
| 5,638,023 | 6/1997 | Kim | 327/537 X |
| 5,666,070 | 9/1997 | Merritt et al. | 326/81 |

*Primary Examiner*—Jan Santamauro
*Attorney, Agent, or Firm*—Marger, Johnson, McCollom, & Stolowitz P.C.

[57] ABSTRACT

A data output buffer of a semiconductor memory device having a data output driver comprised of a pull-up transistor and a pull-down transistor includes a precharging circuit for precharging a gate terminal of the pull-up transistor of the data output driver to a power supply voltage level. Precharging the output driver reduces the load on the pumping voltage generator. This feature, together with precharging the pumping voltage generator itself, allow clocking the pumping voltage generator at a reduced clock rate to reduce power consumption without compromising operating speed of the memory device.

17 Claims, 3 Drawing Sheets

DATA OUTPUT BUFFER FOR USE IN A SEMICONDUCTOR MEMORY DEVICE

BACKGROUND OF THE INVENTION

1. Field of the Invention

The present invention relates to semiconductor memory devices, and more particularly to data output buffers for transmitting data information read-out from memory cells to an exterior of a chip.

The present invention for data output buffers, is based on Korean Patent Application Serial No. 16175/1995 which is incorporated herein by reference for all purposes.

2. Description of the Related Art

Memories have been improved for higher integration, lower power consumption and higher speed operation in order to enhance the performance of a system. Memories using an NMOS type of data output driver employ a boosting circuit for boosting a gate voltage of the NMOS type of pull-up transistor so as to obtain an output data of an appropriate voltage level within a desirable time period. Thus, there occurs a speed loss corresponding to the time required in boosting the gate voltage of the pull-up transistor. Further, if a lower power supply voltage is applied, the boosting voltage lowers, making it difficult to obtain the output data of a desirable voltage level. In the present semiconductor memories for high speed operation, the precharge time and boosting time required in obtaining a proper boosting voltage level becomes shortened, thus deteriorating the boosting efficiency. In addition, with the high speed operation of the memory device, the size of the MOS capacitor seems to be decreased due to the physical limitation of the MOS capacitor, making it difficult to obtain a sufficient boosting efficiency. The gate voltage is boosted from 0 volts to more than the power supply voltage Vcc level by the boosting circuit, causing an increase of a power consumption.

FIG. 1 is a circuit diagram showing a data output buffer according to a prior art. Referring to FIG. 1, a data bit DB is connected in common to the input terminals of inverters 12 and 22. The output terminal of the inverter 12 is commonly connected to the input terminal of an inverter 14 and the gate of a PMOS transistor 20. The output terminal of the inverter 14 is connected to the input terminal of a capacitor 16. An NMOS transistor 18 has its gate and drain which are diode-connected to a power supply voltage Vcc and its source connected to the source of the PMOS transistor 20. A node N4 between the NMOS transistor 18 and PMOS transistor 20 is connected to the output terminal of the capacitor 16. The output terminal of the inverter 22 is connected to the gate of an NMOS transistor 24. The drain of the NMOS transistor 24 is connected to the drain of the PMOS transistor 20 and the source thereof to a ground voltage Vss. A node N5 between the PMOS transistor 20 and NMOS transistor 24 is connected to the gate of an NMOS type of pull-up transistor 26. The drain of the NMOS transistor 26 is connected to the power supply voltage Vcc and the source thereof to the drain of an NMOS type of pull-down transistor 32. An inverted data bit is connected to the input terminal of an inverter 28, and the output terminal of the inverter 28 is connected to the input terminal of an inverter 30. The output of the inverter 30 is connected to the gate of the NMOS transistor 32 which has its source connected to the ground voltage Vss. A node N6 between the NMOS transistors 26 and 32 is connected to the output line OUT.

Operation of the data output buffer according to a prior art will now be discussed. In an initial state of the data output buffer, the voltage of the node N4 is precharged to Vcc-Vth (where Vth refers to a threshold voltage of an NMOS transistor) by the power supply voltage Vcc which is applied through the diode-connected NMOS transistor 18. In this state, if the data bit DB of logic "high" level is input, the voltage of the node N4 is boosted to a predetermined voltage level by a coupling effect of the capacitor 16. In addition, the data bit DB is inverted through the inverter 22, thus making the NMOS transistor 24 nonconducting. The inverted data bit becomes a logic "low" state through the inverters 28 and 30, thus making the pull-down transistor 32 nonconducting. In this case, a boosted voltage is applied to the gate of the NMOS type of pull-up transistor 26, thereby enabling a sufficient conduction of the pull-up transistor 26. Therefore, the power supply voltage Vcc connected to the drain of the pull-up transistor 26 is sufficiently supplied to the output line OUT.

However, such a prior data output buffer has a problem that there occurs a time delay by the boosting operation of the capacitor, thereby deteriorating the high speed operation of the data output buffer. In addition, it has a problem that since it is difficult to boost a low power supply voltage to a desired voltage level, there may occur malfunctions of the data output buffer when the low power supply voltage is applied thereto. Further, the prior data output buffer boosts and uses the power supply voltage to be applied during the data output operation, causing a greater power consumption.

FIG. 2 is a circuit diagram showing another example of the data output buffer according to a prior art. Referring to FIG. 2, the data bit DB is connected to the input terminal of a level shifter 50 the output terminal DOK of which is connected to the gate of an NMOS type of pull-up transistor 56. The level shifter 50 is well known in the art and which will not be discussed in detail. An inverted data bit is connected to the input terminal of an inverter 52 the output terminal of which is connected to the input terminal of an inverter 54. The pull-up transistor 56 has its drain connected to the power supply voltage Vcc and its source connected to the drain of an NMOS type of pull-down transistor 58. The source of the pull-down transistor 58 is connected to the ground voltage Vss and the gate thereof to the output terminal of the inverter 54. A node N7 between the pull-up transistor 56 and pull-down transistor 58 is connected to the output line OUT.

Operation of the data output buffer of FIG. 2 will be discussed. When the data bit DB stays at a logic "high" level, the level shifter 50 outputs a boosted voltage which is in phase with the data bit DB to the gate of the pull-up transistor 56. The inverted data bit of logic "low" level is time-delayed through the inverters 52 and 54 and then is output to the gate of the pull-down transistor 58. Thereby, the pull-up transistor 56 becomes conductive, whereas the pull-down transistor 58 becomes nonconducting. With the conduction of the pull-up transistor 56, the power supply voltage Vcc connected to the drain of the pull-up transistor 56 is sufficiently output to the output line OUT. The operation of the level shifter 50 is well known in the art and which will not be described in detail.

In the data output buffer of FIG. 2, the data output operation of the data output buffer can be performed in a high speed by using a pre-boosted voltage Vpp. However, the gate voltage of the pull-up transistor 56 changes from 0 volts to the pumping voltage Vpp level and upon the data transition, the pumping voltage Vpp is discharged, thus causing a greater power consumption. In addition, since the higher the operation speed, the faster the data transition, the pumping voltage must be supplied at high speed. In this case, however, the precharge time and boosting time required to obtain a desired boosting voltage is not sufficient.

SUMMARY OF THE INVENTION

It is therefore an object of the present invention to provide a data output buffer with high pumping efficiency.

It is another object of the present invention to provide a data output buffer which can reduce power consumption.

It is still another object of the present invention to provide a data output buffer for a high speed operation of a semiconductor memory device.

To achieve the above objects of the present invention, a data output buffer of a semiconductor memory device having a data output driver comprised of a pull-up transistor and a pull-down transistor includes a precharging circuit for precharging a gate terminal of the pull-up transistor of the data output driver to a power supply voltage level; a level shifter connected between a data bit and the gate terminal of the pull-up transistor, for supplying a boosted voltage to the gate terminal of the pull-up transistor; a pumping voltage generator for supplying a pumping voltage to the level shifter; and a clock frequency divider for generating a signal which drives the pumping voltage generator in response to an internal clock signal.

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENT

The present invention will now be described more fully hereinafter with reference to the accompanying drawings, in which a preferred embodiment of the invention is shown.

Figure 3:
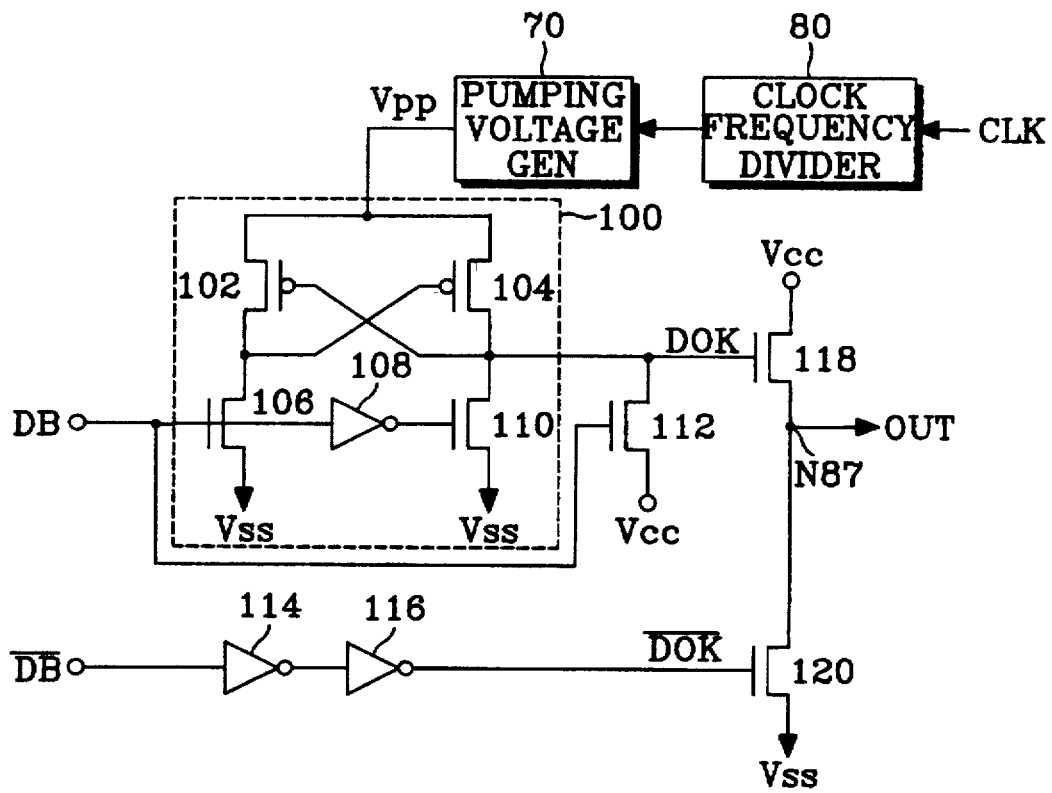
FIG. 3 is a circuit diagram showing a data output buffer according to the present invention.

Referring to FIG. 3, the data bit DB is connected to the input terminal of a level shifter 100. The output terminal DOK of the level shifter 100 is connected to the gate of an NMOS type of pull-up transistor 118 which has its drain connected to the power supply voltage Vcc. Between the output terminal of the level shifter 100 and the gate of the NMOS transistor 118 is connected the source of an NMOS transistor 112 which has its gate connected to the data bit DB and its drain connected to the power supply voltage Vcc. An inverted data bit is connected to the input terminal of an inverter 114 the output terminal of which is connected to the input terminal of an inverter 116. The output terminal of the inverter 116 is connected to the gate of an NMOS type of pull-down transistor 120 which has its drain connected to the source of the pull-up transistor 118 and its source connected to a ground voltage Vss. A node N87 between the source of the pull-up transistor 118 and the drain of the pull-down transistor 120 is connected to the output line OUT.

A pumping voltage generator 70 outputs the pumping voltage Vpp to the driving voltage terminal of the level shifter 100. The input terminal of the pumping voltage generator 70 is connected to the output terminal of a clock frequency divider 80 which receives an internal clock signal CLK. The clock frequency divider 80 is well known in the art and will not be discussed in detail.

Figure 4:
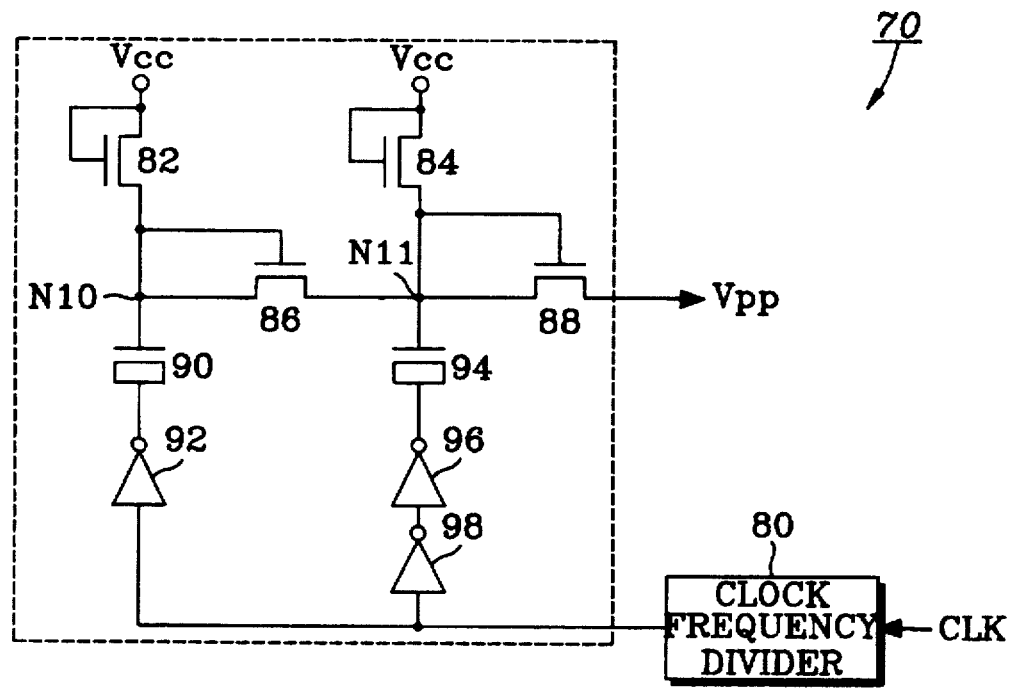
FIG. 4 is a circuit diagram showing a pumping voltage generator of FIG. 3.

FIG. 4 is a circuit diagram showing the pumping voltage generator 70 of FIG. 3. Referring to FIG. 4, the output terminal of the clock frequency divider 80 is connected to the input terminals of inverters 92 and 98. The output terminal of the inverter 98 is connected to the input terminal of an inverter 96, and the output terminals of the inverters 92 and 96 are respectively connected to the input terminals of capacitors 90 and 94. An NMOS transistor 82 has its gate and drain diode-connected to the power supply voltage Vcc and its source connected both to the output terminal of the capacitor 90 and to the drain and gate of an NMOS transistor 86. An NMOS transistor 84 similarly has its gate and drain terminals diode-connected to the power supply voltage Vcc, and its source connected both to the output terminal of capacitor 94 and to the gate and drain of an NMOS transistor 88. The source of the NMOS transistor 86 is connected to the drain of the NMOS transistor 88, and the pumping voltage Vpp, i.e. the driving voltage of the level shifter 100 of FIG. 3 is output from the source of the NMOS transistor 88 to the level shifter 100.

Operation of the pumping voltage generator will now be described. In an initial state, the nodes N10 and N11 are precharged to Vcc-Vth levels. In this state, if the clock frequency divider 100 outputs a logic "high" level, the output of the inverter 92 goes to a logic "low" level, and the output of the inverter 96 goes to a logic "high" level. The voltage at node N10 is pulled-down and the voltage at node N11 is boosted to a predetermined voltage level by a coupling effect of the capacitor 94. This boosted voltage becomes the pumping voltage Vpp, i.e. the driving voltage of the level shifter 100 of FIG. 3.

Figure 1:
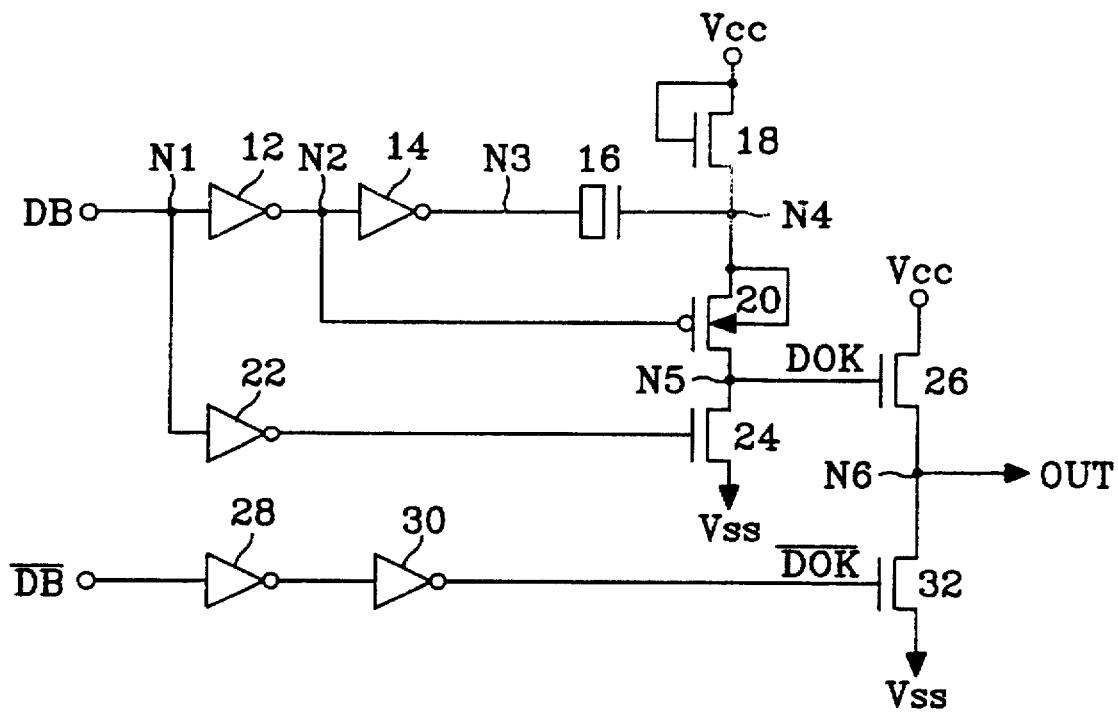
FIG. 1 is a circuit diagram showing one example of a data output buffer according a prior art.
Figure 2:
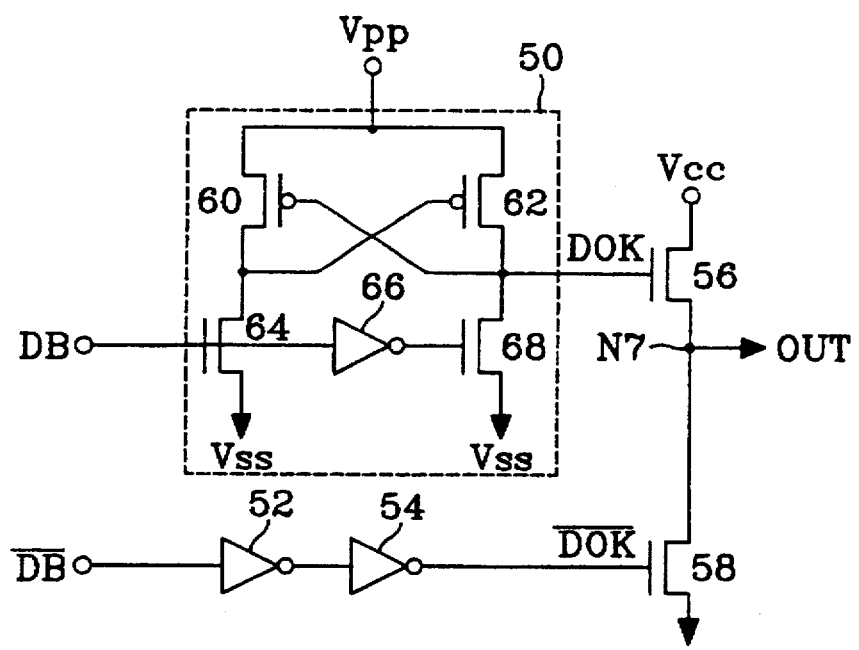
FIG. 2 is a circuit diagram showing another example of a data output buffer according to a prior art.
Figure 5:
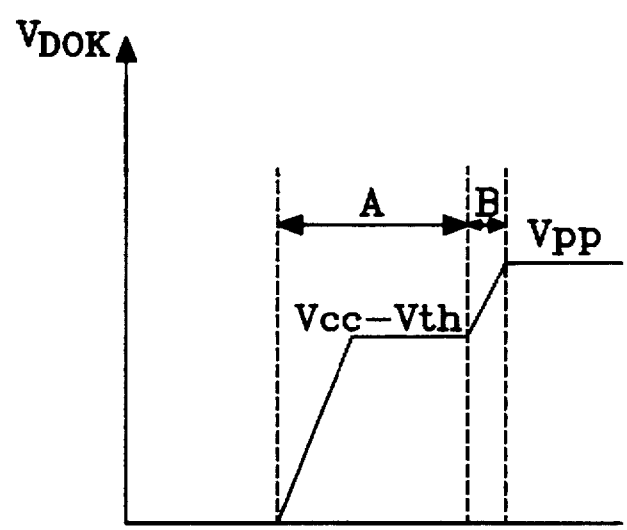
FIG. 5 is a waveform of the gate voltage of a pull-up transistor of FIG. 3.

As described above, the circuit of FIG. 3 is different from that of FIG. 2 in that the voltage of the output terminal DOK is precharged to a predetermined voltage level prior to being boosted to the pumping voltage level, thereby reducing the amount of charge required of the pumping voltage generator. The output terminal DOK of the level shifter 100 is precharged to a predetermined voltage level by the power supply voltage Vcc which is transmitted through the current path of the NMOS transistor 112. Thus, the voltage of the output terminal DOK does not swing from 0 volts to the pumping voltage Vpp level, but swings from a precharge voltage level Vcc-Vth to the pumping voltage Vpp level. This reduces the charge amount which should that must be applied from the pumping voltage generator 70, enabling the output terminal DOK to be boosted to a desired voltage level at high speed. FIG. 5 shows a waveform of the voltage at the output terminal DOK of FIG. 3. Referring to FIG. 5, the precharge circuit, i.e. the NMOS transistor 112, precharges the voltage at the output terminal DOK to Vcc-Vth during period A, and the level shifter 100 determines the voltage level of the output terminal DOK during the period B.

High speed operation of the semiconductor memory device allows a short operation cycle of the boosting circuit, resulting in a problem of inadequate precharge time necessary to obtain a desirable boosting voltage. However, this problem can be solved by the power supply voltage Vcc transmitted through the NMOS transistor 112. The clock frequency divider 80 receives the internal clock signal CLK which is synchronized with an external control signal, such as a row address strobe or a column address strobe, and then generates a signal the frequency of which is equal to or less than that of the internal clock signal CLK. To illustrate, we assume that the internal clock signal CLK is frequency-divided by two. Thus, if the output terminal DOK of the level shifter 100 is driven twice, the pumping voltage generator is driven one time. For example, if data is output every 10 nsec, the conventional pumping voltage generator is driven every 10 nsec, whereas the pumping voltage generator of the present invention is driven every 20 nsec. Thereby, it is possible to secure the precharge time and boosting time required in obtaining a desirable boosting voltage in the pumping voltage generator. Further, the data output buffer as described above can secure a stable output operation even when a low power supply voltage is applied thereto.

While there has been illustrated and described what is considered to be preferred embodiment of the present invention, it will be understood by those skilled in the art that various changes and modifications may be made without departing from the scope of the present invention. Therefore, it is intended that the present invention not be limited to the particular embodiment disclosed as the best mode contemplated for carrying out the present invention, but that the present invention includes all embodiments falling within the scope of the appended claims.

What is claimed is:

1. A data output buffer for use in a semiconductor memory device having a data output driver comprised of a pull-up transistor and a pull-down transistor, said data output buffer comprising:

a level shifter connected between a data bit line and said gate terminal of said pull-up transistor, for supplying a boosted voltage to said gate terminal of said pull-up transistor;

a pumping voltage generator for supplying a pumping voltage Vpp to said level shifter; and a precharging circuit for precharging the gate terminal of said pull-up transistor to a predetermined voltage level.

2. A data output buffer according to claim 1 wherein the precharging circuit is arranged so as to precharge the said gate terminal to substantially a power supply voltage Vcc and the level shifter further boosts the gate terminal to a boosted voltage level greater than the power supply voltage Vcc responsive to the data bit line.

3. A data output buffer according to claim 1 wherein the precharging circuit comprises switch means coupled between a power supply voltage Vcc and the said gate terminal of the pull-up transistor, the switch means having a control terminal coupled to the data bit line so as to precharge the said gate terminal to substantially the power supply voltage Vcc responsive to the data bit line.

4. A data output buffer according to claim 3 wherein the switch means comprises a transistor.

5. A data output buffer according to claim 3 wherein the switch means comprises an MOS transistor.

6. A data output buffer according to claim 1 wherein said pumping voltage generator includes:

clock input means for receiving a clock input signal;

a capacitor for boosting a capacitor node voltage in response to each cycle of the clock input signal;

output means coupled to the capacitor node to provide substantially the capacitor node voltage as the pumping Vpp; and a second precharging circuit coupled to the capacitor node for precharging the capacitor node to a predetermined voltage.

7. A data output buffer according to claim 6 wherein the second precharging circuit comprises diode means having an input coupled to a power supply voltage Vcc and having an output coupled to the capacitor node for precharging the capacitor node to substantially the power supply voltage Vcc less a predetermined diode voltage drop.

8. A data output buffer according to claim 7 wherein the diode means for precharging comprises a diode-connected MOS transistor.

9. A data output buffer according to claim 6 wherein the clock input means includes a clock frequency divider having an input coupled to receive an internal clock signal, such that the capacitor node voltage is boosted in response to a reduced-frequency clock signal.

10. A data output buffer according to claim 9 wherein said clock frequency divider comprises a divide-by-two circuit so that the reduced-frequency clock signal has a frequency equal to one-half of the internal clock signal frequency.

11. A data output buffer according to claim 1 wherein the pumping voltage generator includes:

a first capacitor coupled to a first capacitor node;

a first capacitor precharging means coupled to the first capacitor node for precharging the first capacitor node to a predetermined voltage level;

a second capacitor coupled to a second capacitor node;

a second capacitor precharging means coupled to the second capacitor node for precharging the second capacitor node to a predetermined voltage level;

logic means for alternately boosting one at a time of the first and second capacitors to a boost voltage higher than the precharging voltage level responsive to alternate phases of the clock input signal; and output means for coupling said boosted one at a time of the first and second capacitors to an output node to provide the pumping voltage.

12. A data output buffer according to claim 11, wherein each of the first and second capacitor precharging means includes diode means having an input coupled to a power supply voltage Vcc and an output coupled to the respective capacitor node.

13. A data output buffer according to claim 12 wherein the output means includes a diode means disposed between the first and second capacitor nodes.

14. A data output buffer according to claim 12 wherein the output means includes a diode means disposed between one of the capacitor nodes and the output node.

15. A data output buffer according to claim 14 wherein the diode means comprises a diode-connected MOS transistor.

16. A method of boosting a gate voltage of a pull-up transistor in a data output buffer of a semiconductor memory device having a power supply voltage source Vcc, said method comprising the steps of:

precharging said gate voltage of said pull-up transistor to a predetermined precharge voltage level; and then boosting the gate voltage from the predetermined precharge voltage to a pumping voltage level in response to a data bit line.

17. A method according to claim 16 wherein said precharging step comprises precharging the gate voltage to substantially the power supply voltage Vcc less a transistor threshold voltage.

* * * * *